United States Patent [19]

Polivka

[11] Patent Number: 5,068,776
[45] Date of Patent: Nov. 26, 1991

[54] SWITCHED-MODE DC-DC POWER CONVERTER FOR REDUCING EFFECTS OF MAGNETIZATION CURRENT

[75] Inventor: William M. Polivka, Endicott, N.Y.

[73] Assignee: International Business Machines Corporation, Armonk, N.Y.

[21] Appl. No.: 619,608

[22] Filed: Nov. 29, 1990

[51] Int. Cl.⁵ .............................. H02M 3/335
[52] U.S. Cl. ........................... 363/17; 363/97; 363/98; 363/132
[58] Field of Search .................. 363/17, 22, 23, 24, 363/25, 26, 55, 56, 97, 98, 132, 133, 134

[56] References Cited

U.S. PATENT DOCUMENTS

| | | | |
|---|---|---|---|
| 4,162,524 | 7/1979 | Jansson | 363/25 |
| 4,184,197 | 1/1980 | Cuk et al. | 363/16 |
| 4,328,538 | 5/1982 | Pollmeier | 363/56 |
| 4,389,702 | 6/1983 | Clemente et al. | 363/97 |
| 4,456,872 | 6/1984 | Froeschle | 363/21 |
| 4,680,687 | 7/1987 | Stasch et al. | 363/131 |
| 4,710,859 | 12/1987 | Rilly | 363/97 |
| 4,719,559 | 1/1988 | Sokal et al. | 363/132 |
| 4,744,020 | 5/1988 | Cavagnolo | 363/56 |
| 4,939,633 | 7/1990 | Rhodes et al. | 363/98 |
| 4,952,819 | 8/1990 | Herrmann | 307/282 |

Primary Examiner—J. Sterrett
Attorney, Agent, or Firm—Douglas M. Clarkson

[57] ABSTRACT

A circuit structure is described for a switched-mode DC-DC converter to eliminate the degrading effect of magnetization current on sensed load current, by forming the power transformer with an additional winding, other than its usual primary and secondary windings. The additional winding is coupled magnetically with the power transformer to obtain a voltage proportional to the voltage on the primary of the power transformer, but the additional winding is connected electrically in series with the secondary winding of a current-sensing transformer. A current-sensing circuit is described that includes the additional winding and the current-sensing transformer in order to effectively eliminate the effects of the magnetization current from the sensed load current.

15 Claims, 8 Drawing Sheets

SWITCHED-MODE DC-DC POWER CONVERTER FOR REDUCING EFFECTS OF MAGNETIZATION CURRENT

BACKGROUND OF THE INVENTION

1. Field of the Invention

The present invention, generally, relates to switched-mode DC-DC power converters and, more particularly, to a new and improved circuit interconnected to substantially reduce the degrading effects of magnetization current on sensed load current.

To clarify what otherwise could be misleading nomenclature, the term "switched-mode" is used interchangeably with "switch-mode" within the technical field with which the invention relates, whereas in some patent areas, only the term "switch-mode" is found. In connection with the present description, the term "switched-mode" is used, but if a reader prefers, it may be read "switch-mode".

Similarly, a "DC-DC" converter is used as an intermediate element in many circuits that perform AC-AC, AC-DC, or DC-AC power conversion. Consequently, a circuit known as a "DC-DC converter" might be found in the art disguised in another form.

Also, it could be important to a reader of the present description to be aware of the distinction between a coupled inductor and a transformer, since an inductor is shown schematically the same as a transformer in electrical drawings and could be called, though erroneously, a transformer. A coupled inductor is used to store energy, while a transformer is not. The undesirable magnetization current of a transformer functions just like stored energy, but it would not be there if it could be eliminated, because it is deleterious to the control of DC-DC power converters.

A DC-DC converter is used customarily in conjunction with a control circuit to provide either a constant output voltage or one that is otherwise regulated from a voltage source that is subject to variations. A well known and useful technique used in the design of the control circuit requires an accurate sensing of the current in the inductor of the output LC filter, but this current usually is unreliable because of the degrading effect of transformer magnetization current.

A widely used technique to control DC-DC power converters requires a knowledge of its output current, and it is common practice to obtain it indirectly from the input current by sensing the current in the power transistors that switch the current in the primary of the power transformer. The current that is sensed in the power transistors is the sum of the magnetization current of the power transformer and the output current that is reflected to the primary.

Sensing this natural summation is useful for protecting the power switches from excessive currents, but in many practical instances, it is undesirable for control purposes due to the unstable effects on it by the transformer magnetization current.

The present trend toward miniaturization of electrical and electronic circuits compounds the problem further because miniaturization of power transformers often produces much more magnetization current than is desired. This increase in the magnetization current can compromise the design of the control circuit and lead to reduced performance.

Moreover, since the permeability of the core material of the power transformer is highly temperature-dependent, variations in ambient temperature can produce large changes in the magnetization current, making its control even more difficult. The effect of temperature on magnetization current is a complicated function, and this fact together with the usual wide range of manufacturing tolerance variations, a large range of input voltages applied and the customary variations in component values, serve to make any form of control loop of uncertain effectiveness. Normally, exceedingly complex electronic circuitry is required to achieve an acceptable performance level.

2. Description of the Prior Art

U.S. Pat. No. 4,162,524 to Jansson is entitled "DC-DC Converter" but describes only a technique for protecting the transistor switches of the converter that is responsive to the rate of change of current, not current magnitude. Therefore, the principle involved is at variance with the present invention.

U.S. Pat. No. 4,184,197 entitled "DC-TO-DC Switching Converter" to Cuk et al. describes a circuit for receiving only nonpulsating input current and does not use current sensing or control.

U.S. Pat. No. 4,680,687 to Stasch et al. is entitled "Switch-Mode Power Supply Having a Free-Running Forward Converter" and describes an arrangement to permit a switching transistor to be actuated only when the current is reduced to zero.

OBJECTS AND SUMMARY OF THE INVENTION

A principal object of the present invention is to provide an arrangement for a switched-mode, DC-DC power converter that minimizes the adverse effects of magnetization current on the sensing of a load current.

It is also an important object of the invention to provide an arrangement for a switched-mode, DC-DC power converter to eliminate substantially the magnetization current from the sensed current signal.

Another object of the invention is to provide an improved switched-mode, DC-DC power converter that permits a current sensing signal to be generated without the degrading effects of a magnetization current or adverse effects caused by changes in ambient temperature.

Briefly, a switched-mode DC-DC power converter that is constructed and arranged in accordance with the present invention has a power transformer with primary and secondary windings that isolate an input from an output. A current-sensing transformer has a winding connected with the primary winding of the power transformer to sense a load current in the secondary winding of the power transformer. A current-sensing circuit includes a winding coupled magnetically with the power transformer to effectively eliminate the magnetization current from the sensed load current.

These, other and further objects, advantages and features of the present invention will become more readily apparent from the following detailed description of the invention taken in conjunction with the following drawings.

DETAILED DESCRIPTION OF THE INVENTION

The present invention provides a substantial improvement over presently used, transformer-isolated, current-sensing circuits in the form of DC-DC power converters. The technique of the invention requires only one additional winding on the power transformer, and with it connected as described hereinafter, a more accurate current-sensing, and consequently a higher performance, is obtained even using the current-to-voltage circuits that are so prevalent today.

In accordance with a principal aspect of the invention, the magnetization current of the current-sensing transformer is used uniquely to severly limit the adverse effect that the magnetization current of the power transformer usually has on the sensed load current. Actually, if done properly, following the description to be given now, the effect of the magnetization current of the power transformer is substantially eliminated from the sensed load current.

Figure 1:
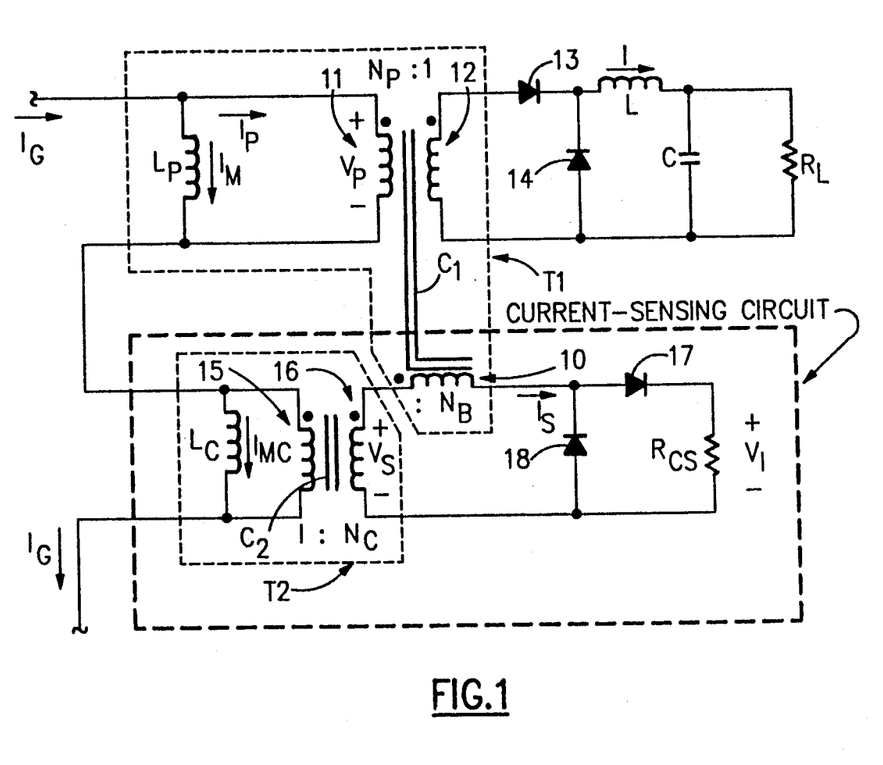
FIG. 1 is an equivalent circuit with models of a power transformer and a current-sensing transformer to illustrate the features of the invention in a switched-mode, forward DC-DC power converter.

In its simplest form, an arrangement according to the invention is shown in FIG. 1 of the drawings, which shows the essential elements of the invention as applied to a common two-switch forward DC-DC converter. The equivalent circuit of FIG. 1, illustrating one aspect of the features of the present invention, has an additional winding 10 magnetically coupled with a power transformer $T_1$ but connected electrically with a current-sensing transformer $T_2$.

A significant advantage of an arrangement according to the invention is realized when the power transformer $T_1$ and the current-sensing transformer $T_2$ both are constructed of the same material, since this renders the current-sensing action free from the effects of temperature changes, to be described in more detail presently.

In FIG. 1, a power transformer $T_1$ comprises a primary winding 11 and a secondary winding 12 wound on a core $C_1$ in customary fashion. The primary winding 11 receives an input current $I_G$. The internal inductance of the power transformer $T_1$ is illustrated by an inductor $L_P$ with the magnetization current illustrated by the legend $I_M$. The remainder of $I_G$ (with $I_M$ subtracted) is the component $I_p$ in the primary winding 11. $I_M$ and $I_p$ are the result of a voltage $V_p$ applied across the primary winding 11.

Secondary winding 12 of the power transformer $T_1$ is connected through a rectifying diode 13 and a freewheeling diode 14 through a standard LC filter circuit with a current I to a load, indicated by a resistor $R_L$. The turns ratio of the primary of the power transformer $T_1$ to its secondary is indicated by the legend $n_p:1$.

Current-sensing transformer $T_2$ comprises primary winding 15 and a secondary winding 16 wound on a magnetic core $C_2$. The internal inductance of the current-sensing transformer $T_2$ is represented by an inductor $L_C$, and the magnetization current of the current-sensing transformer is represented by the legend $I_{MC}$. The turns ratio of the primary of the transformer $T_2$ to its secondary is indicated in FIG. 1 by the legend $1:n_c$.

The primary winding 15 of the current-sensing transformer $T_2$ will be excited by that component of $I_G$ remaining after subtracting its magnetization current $I_{MC}$. The secondary winding 16 is connected serially with the additional winding 10 of the power transformer $T_1$ and a rectifying diode 17 to a resistor $R_{cs}$ in order to convert the current $I_s$ in the secondary of the current-sensing transformer $T_2$ in one direction to a voltage $V_I$ of a magnitude depending upon the resistor $R_{cs}$ which, in turn, depends upon the use to which this voltage is needed. A diode 18 is connected to provide a path for the current in the reverse direction. That portion of FIG. 1 within a broken line is identified as a current-sensing circuit.

The turns ratio of the additional winding 10 wound on the core $C_1$ to the secondary winding 12 will equal a number that is a matter of choice depending upon the use desired. For example, whether the effect of the magnetization current of the power transformer $T_1$ is to be eliminated completely or is to be reduced to some other desired value, the number of turns for the winding 10 will be determined by equation (2) as described hereinafter.

The additional winding 10 of the power transformer $T_1$ is connected in series with the secondary winding 16 of the current-sensing transformer $T_2$, such that the current $I_s$ leaving the positive end of the winding 16 enters the positive end of the additional winding 10 when the primary winding 11 of the power transformer $T_1$ is energized by the voltage $V_p$. Equivalently, the voltage on the winding 10 adds to the voltage $V_I$ when the voltage $V_p$ is applied to the winding 11.

Figure 2:
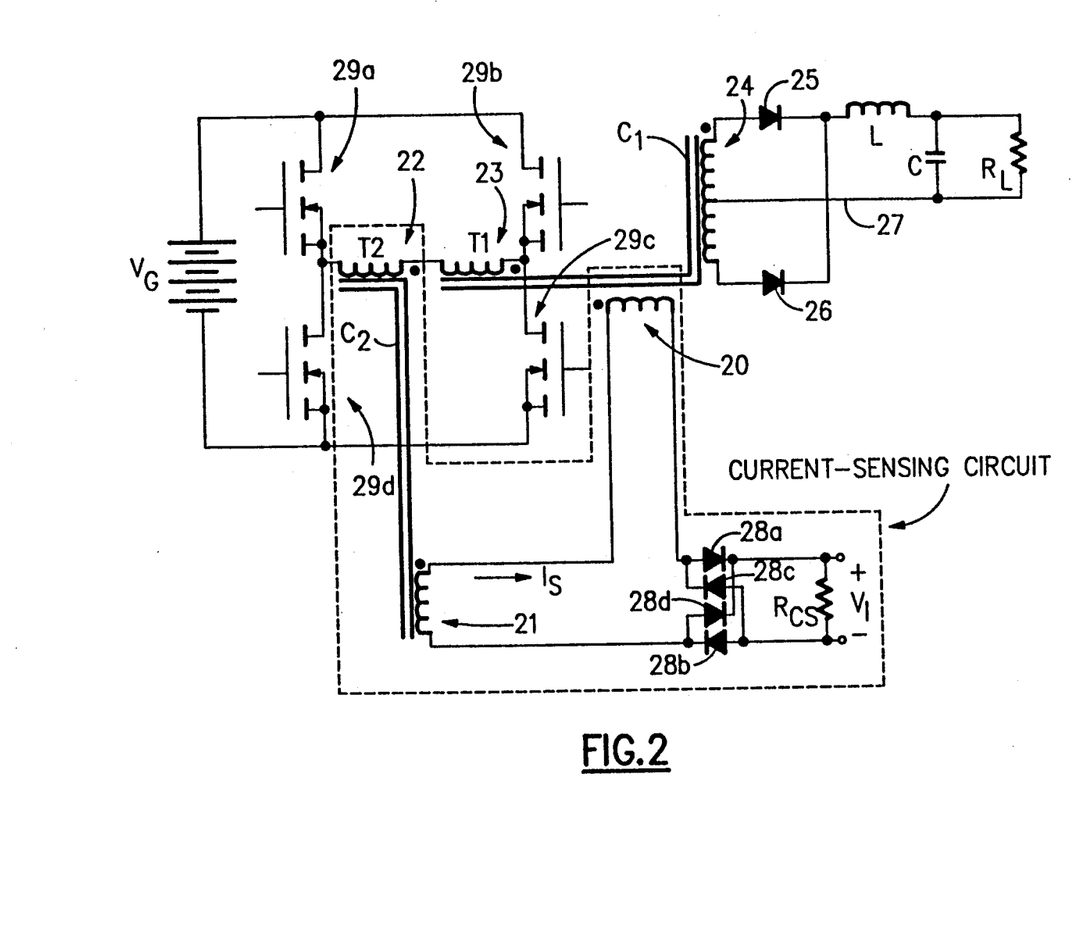
FIG. 2 shows a conventional full bridge DC-DC converter with the arrangement of the invention included as an illustration of the general applicability of the invention.

FIG. 2 of the drawings is a view showing the concept of a conventional full bridge DC-DC power converter circuit with an additional winding 20, according to the invention, coupled magnetically with the power transformer $T_1$. Like in FIG. 1, the additional winding 20 is connected electrically in series with a secondary winding 21 of the current-sensing transformer $T_2$, and the voltage on the additional winding 20 adds to the voltage $V_I$ when a voltage is applied to a primary winding 23 on the power transformer $T_1$.

A primary winding for the current-sensing transformer $T_2$ is identified by the numeral 22. The primary windings 22 and 23 are connected in a bridge circuit with transistors 29a, 29b, 29c and 29d, which are Metal Oxide Semiconductor Field Effect Transistors, or "MOSFETs".

A center tapped secondary winding 24 is connected through rectifying diodes 25 and 26 and a customary LC filter to a load $R_L$. The return connection for the LC filter and the load is made to the center tap 27 of the secondary winding.

In the current-sensing circuit, identified by a legend in FIG. 2, the additional winding 20, that is coupled magnetically with the secondary and the primary of the power transformer $T_1$, is connected electrically with the secondary winding 21 of the current-sensing transformer $T_2$, the output of this arrangement being connected through four rectifying diodes 28a, 28b, 28c and 28d to a resistor $R_{cs}$, which converts the current in the secondary of the transformer $T_2$ to a voltage $V_I$, like in FIG. 1.

Figure 3:
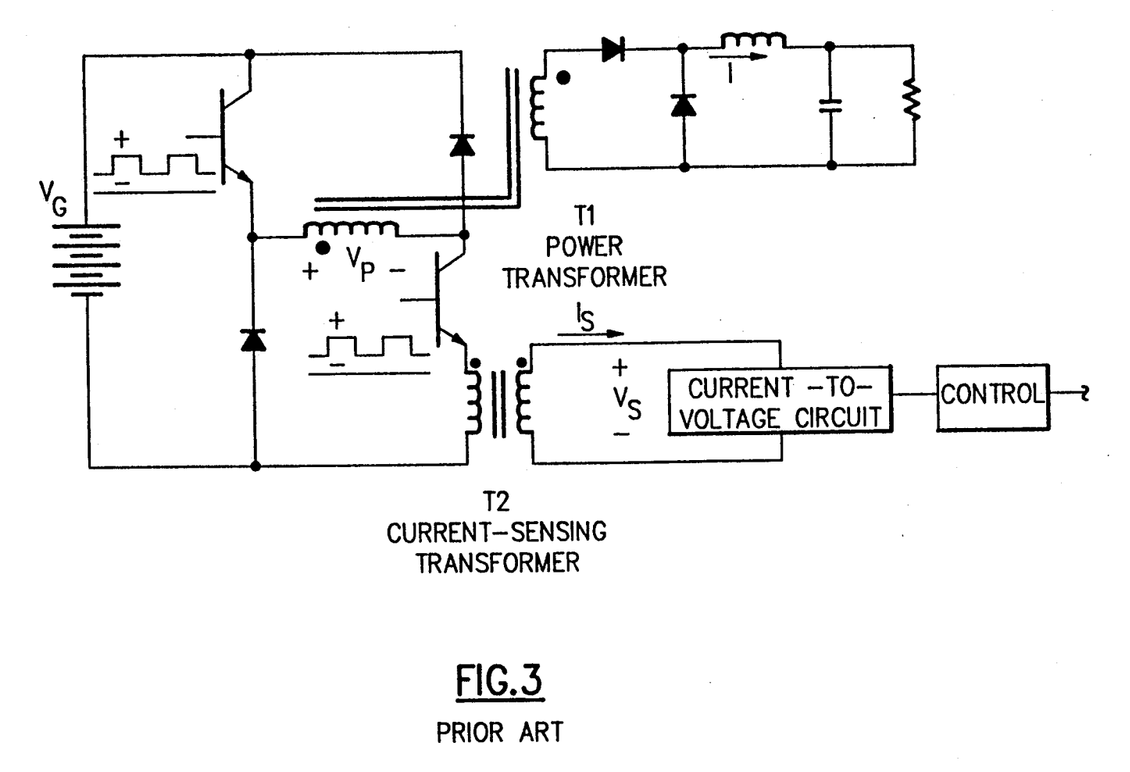
FIG. 3 is an illustration of a two-transistor forward converter with a winding of a current-sensing transformer connected in accordance with the prior art with no means to achieve a controlled compensation for magnetization current.

FIG. 3 of the drawings illustrates a two transistor forward converter without an arrangement in accordance with the present invention, i.e., this is prior art. The power transformer is indicated by the legend $T_1$, and the current-sensing transformer is indicated by the legend $T_2$.

Figure 4:
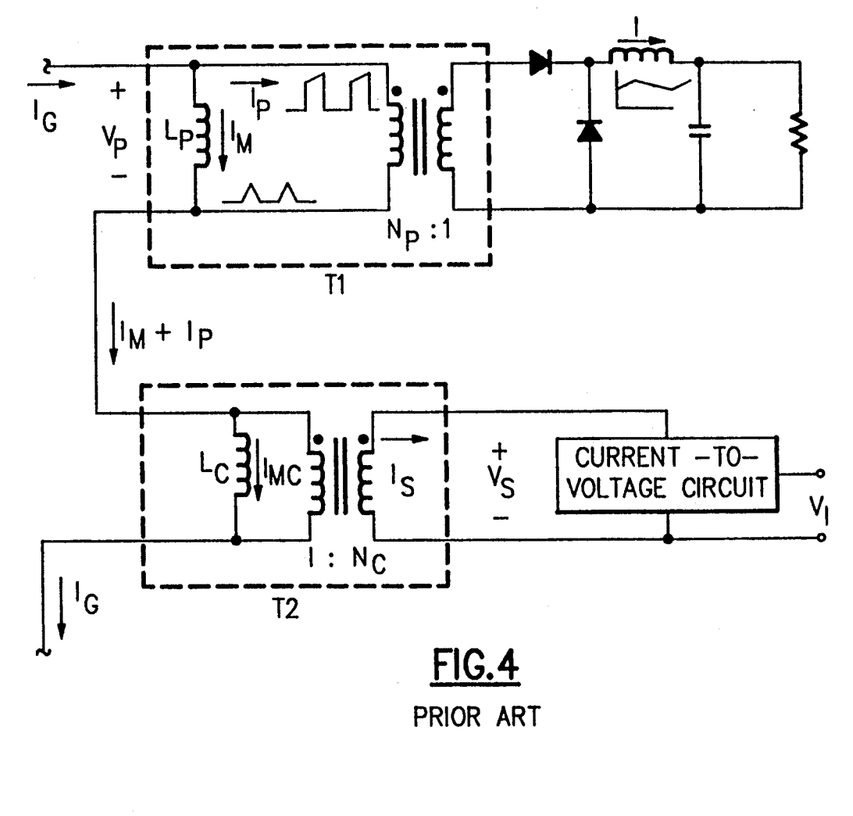
FIG. 4 is an illustration of the essential elements of FIG. 3 with equivalent circuit representations of the transformers to show the respective magnetization inductances.

FIG. 4 illustrates the problem of the arrangement shown in FIG. 3 by showing wave forms at various points in the circuit. Also, the essential elements of FIG. 3 are highlighted in FIG. 4, where the respective transformers are shown as equivalent circuits to indicate their magnetization inductances $L_P$ and $L_C$ separately. This will become clearer as the present description proceeds.

Conventional current-sensing circuits produce a voltage $V_I$ that is proportional to $I_s$, which contains a component of the magnetization current $I_m$ of the power transformer $T_1$ that degrades the sensed current $I_s$. The present invention solves this problem by providing a circuit which automatically controls $I_{mc}$ by controlling $V_s$, such that $I_{mc}$ compensates exactly for the magnetization current $I_m$ of the power transformer, making $I_s$ proportional to $I_p$.

It is easily shown that $I_{mc} = I_m$ under the condition that:

$$V_s = \frac{n_c \times L_c}{L_p} V_p \qquad (1)$$

where:
$V_s$ = voltage on secondary of the current-sensing transformer;
$n_c$ = turns ratio of current-sensing transformer secondary to primary;
$L_c$ = inductance on primary side of the current-sensing transformer;
$L_p$ = inductance on primary side of the power transformer;
$V_p$ = voltage on primary of the power transformer.

The circuit illustrated in FIG. 1 approximates the above relationship very closely, in that the additional winding 10 is located physically on the power transformer $T_1$ and is connected electrically in series with the secondary of the current-sensing transformer $T_2$. The expression "located physically" also means "coupled magnetically".

In another aspect of the present invention, by adjusting the turns ratio separately or in combination with the inductances $L_c$ and $L_p$ (The power transformer $T_1$ and the current-sensing transformer $T_2$ can readily be designed for a desired $L_p$ and $L_c$ to match a selected turns ratio.), the magnetization current $I_{mc}$ developed in the current-sensing transformer $T_2$ will cancel completely the effect of the magnetization current $I_m$ in the sensed load current. Where $V_I << V_s$, the turns ratio to accomplish this cancellation is given by the relationship:

$$\frac{L_c}{L_p} = \frac{n_B}{n_p \times n_c} \qquad (2)$$

where:
$L_c$ = inductance on primary side of the current-sensing transformer;
$L_p$ = inductance on primary side of the power transformer;
$n_B$ = turns ratio of additional winding to power transformer secondary;
$n_p$ = turns ratio of primary winding to power transformer secondary;
$n_c$ = turns ratio of current-sensing transformer secondary to primary.

The above described cancellation of the effect of the magnetization current $I_{mc}$ of the power transformer on the sensed current is accomplished automatically as part of the sensing process.

The currents $I_{mc}$ and $I_m$ are determined by the voltages that appear across $L_c$ and $L_p$, respectively. Since the voltage on the additional winding (10 in FIG. 1; 20 in FIG. 2) is proportional to $V_p$, connection of the additional winding electrically in series with the secondary winding of the current-sensing transformer forces the voltage across $L_c$ to be proportional to the voltage across $L_p$. Thus, $I_{mc}$ is forced to be proportional to $I_m$, and cancellation is achieved in accordance with the relationships (1) and (2) above.

As has been described previously hereinabove but repeated here for emphasis, when both transformers are constructed with cores of the same material and are kept in close proximity so that they are assured of being at the same temperature, the cancellation is automatic at all ambient temperatures and at all operating points. Therefore, the need for complex and expensive compensating circuitry is avoided.

Figure 5:
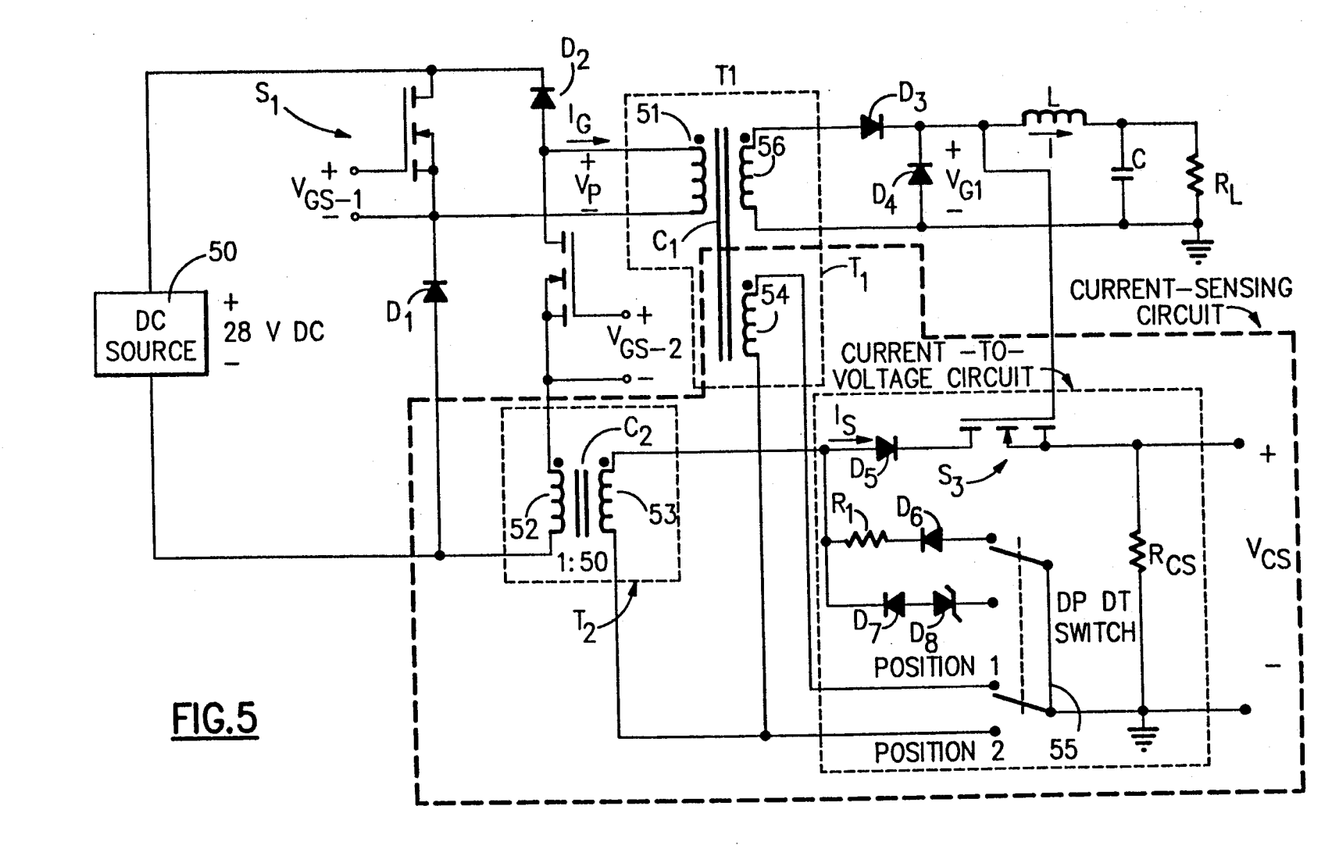
FIG. 5 is a detailed circuit to illustrate the effectiveness of the invention, with a double pole double throw (DPDT) switch to show, in position 1, the arrangement of the invention in the circuit and, in position 2, to show the arrangement of the invention out of the circuit.

A structure in accordance with the invention has been implemented successfully and verified experimentally on two different DC-DC converter topologies, one of which is the common two-switch forward converter that is illustrated in FIG. 5 of the drawings.

In FIG. 5, a DC source 50 is connected across a switching transistor $S_1$ (a "MOSFET"—a Metal Oxide Semiconductor Field Effect Transistor) in series with a diode $D_1$. A voltage $V_{GS-1}$ (Gate-to-Source) is connected across the gate terminal of the transistor $S_1$ and to a point intermediate the transistor $S_1$ and the diode $D_1$.

The negative terminal of the voltage $V_{GS-1}$ is connected also to one side of a primary winding 51 of the power transformer $T_1$. A second voltage $V_{GS-2}$, equal to but galvanically isolated from the first $V_{GS-1}$, is connected to the gate terminal of a MOSFET $S_2$ like the transistor $S_1$ and to one side of the primary winding 52 of a current-sensing transformer $T_2$. A diode $D_2$ is like the diode $D_1$. The opposite side of the primary winding 51 is connected to the diode $D_2$.

The current-sensing transformer $T_2$ produces current at its secondary winding 53, which must be converted to a voltage for use by other circuits. A resistor $R_{cs}$ is the actual element for converting current-to-voltage at this point, but it needs the help of some other elements also, like a switching transistor and diodes, to produce a desired wave form. Actual values for one switched-mode DC-DC converter, that is constructed and arranged in accordance with the present invention as shown in FIG. 5 of the drawings, are given in a chart, infra.

Shown also in FIG. 5 within a broken line are those elements making up a "current-sensing circuit" (identified with a legend), according to the invention. These elements include an additional winding 54 that is located physically in magnetic coupling relationship with the power transformer $T_1$ but is connected electrically in series with the secondary winding 53 of the current-sensing transformer $T_2$, such that current leaving the positive end of winding 53 enters the positive end of the winding 54 when the primary winding 51 is energized by the voltage $V_p$, whereby the adverse effect of magnetization current of the power transformer $T_1$ on the voltage $V_{cs}$ is eliminated. Equivalently, the voltage on the additional winding 54 adds to the voltage $V_{cs}$ when the voltage $V_p$ is applied to the winding 51.

A Double-Pole, Double-Throw (DPDT) switch is identified also by the reference numeral 55 in FIG. 5 and connects the additional winding 54 in the DC-DC converter circuit (in position 1) and, then in position 2, removes it, for the purpose of showing the effectiveness of the invention. The DPDT switch 55 is NOT normally in the circuit.

While values of other elements in the circuit are given in the following Chart, the element identified by the legend $S_3$ is a small n-channel MOSFET that is used here as a switch. It prevents current from circulating in the secondary winding 53 of the current-sensing transformer $T_2$ while the primary power transistors $S_1$ and $S_2$ are non-conducting (turned off), and the elements $S_3$ allows the current to be sensed only while the primary power transistors $S_1$ and $S_2$ are conducting (turned on), since its gate terminal is connected to the secondary winding 56 of the power transformer $T_1$ making switch $S_3$ responsive to the voltage $V_{G1}$.

The core of transformer $T_1$ is part No. P-42620-UG, by Magnetics, Inc.; primary turns=4; secondary turns=2 and the additional winding=3 turns. The core of transformer $T_2$, by Magnetics, Inc., is part No. P-42016-UG; primary turns=50 and the secondary=1 turn. The switching frequency used was 100 kH. $T_1$ and $T_2$ had a gap of approximately 2 mils. A chart of the values used in the arrangement of FIG. 5 is as follows:

| CIRCUIT ELEMENT | VALUE |
| --- | --- |
| $S_1, S_2$ | 2N6764 |
| $S_3$ | 2N6782 |
| $D_1, D_2$ | 1N5806 |
| $D_3, D_4$ | 1N6391 |
| $D_5, D_6, D_7$ | 1N4148 |
| $D_8$ | 1N4471 |
| L | 7.5 micro-Henrys |
| C | 125 micro-Farads |
| $R_{cs}$ | 5.1 Ohms |
| $R_1$ | 1000 Ohms |

Figure 6:
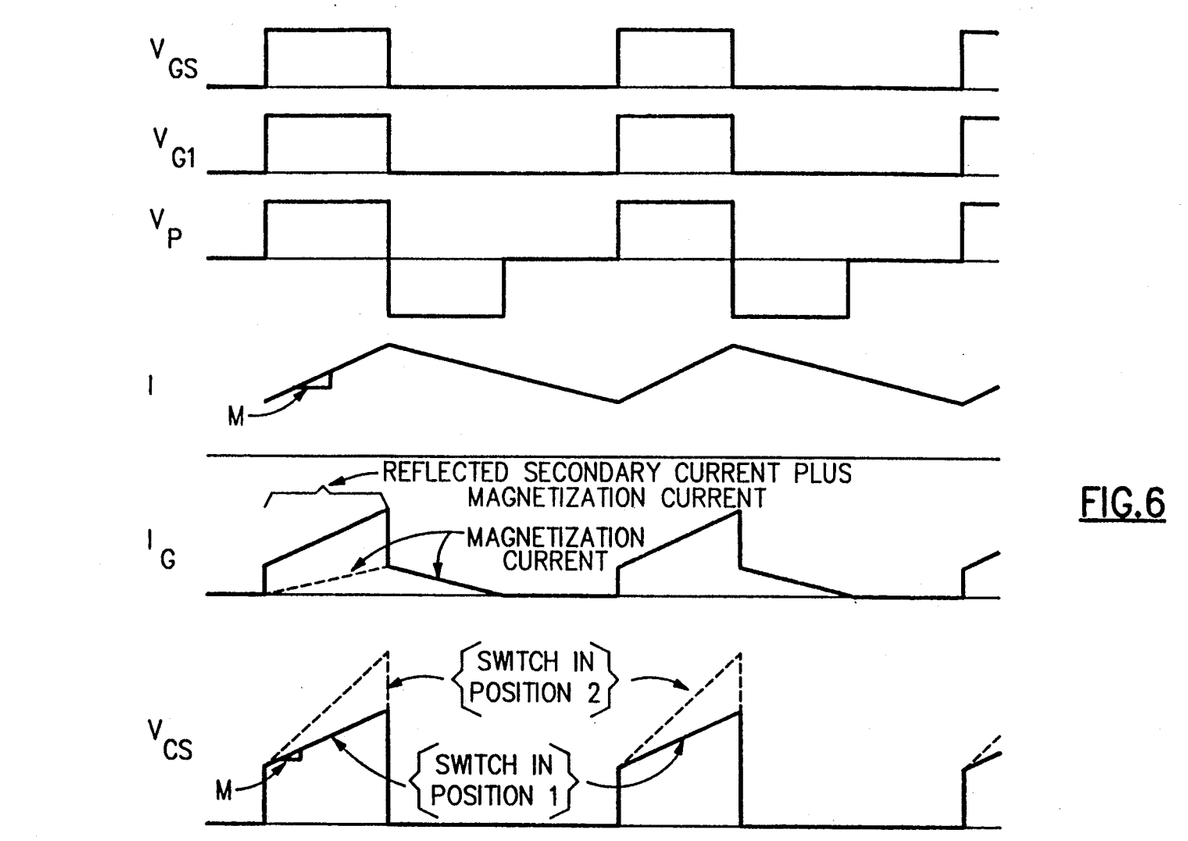
FIG. 6 is a timing chart illustrating the relative interrelationship of respective voltage and current signals that are indicated in FIG. 5.

FIG. 6 shows the relative time relationship between various voltages and currents and reveals the effect of the present invention in keeping the slope M of the voltage $V_{cs}$ more in line with the slope M of the current I.

A purpose of any DC-DC converter is to operate in conjunction with a control circuit, such that the combination will produce, from a variable voltage source, an output voltage that is constant, or otherwise regulated, independent of variations in the source voltage or load current. In the design of the control circuit, which is to operate with the DC-DC converter, the current I (in the inductor L of the LC filter) must be known, but since its magnitude can be quite large, it can be inconvenient (not too practical) to obtain its value directly.

It is much more practical to determine the large current I by obtaining the value (magnitude) of another, smaller current that has a known, predictable relationship to the current I. Such a current is the usually small current $I_G$ in the primary winding of the Power transformer $T_1$, but this $I_G$ includes a component that has a detremental, or degrading, effect, which makes a sensed current $I_G$ unreliable in its relationship to the current I.

This component is the magnetization current $I_m$, shown in FIG. 1 and described in more detail hereinabove. Any sensing of the current $I_G$ should be made as accurately as possible because it is a small current, and most likely, it is varible along with any variations in the voltage 50.

Of particular importance in sensing this current $I_G$ is information on the slope M, in FIG. 6, of the current I, because the slope of the sensed current should bear a consistent relationship to the slope M of the current I. The present invention converts the sensed current $I_s$ into the voltage $V_{cs}$ by using a resistance $R_{cs}$, FIG. 5, and its success is indicated by the slope M on the voltage curve $V_{cs}$, FIG. 6.

Of course, a complete power supply circuit would embody other components, but the present invention only concerns the sensing of the current and the control of such current, and therefore, the circuits in the present drawings are shown so as not to confuse the contribution which the improvement of the invention makes.

Figure 7:
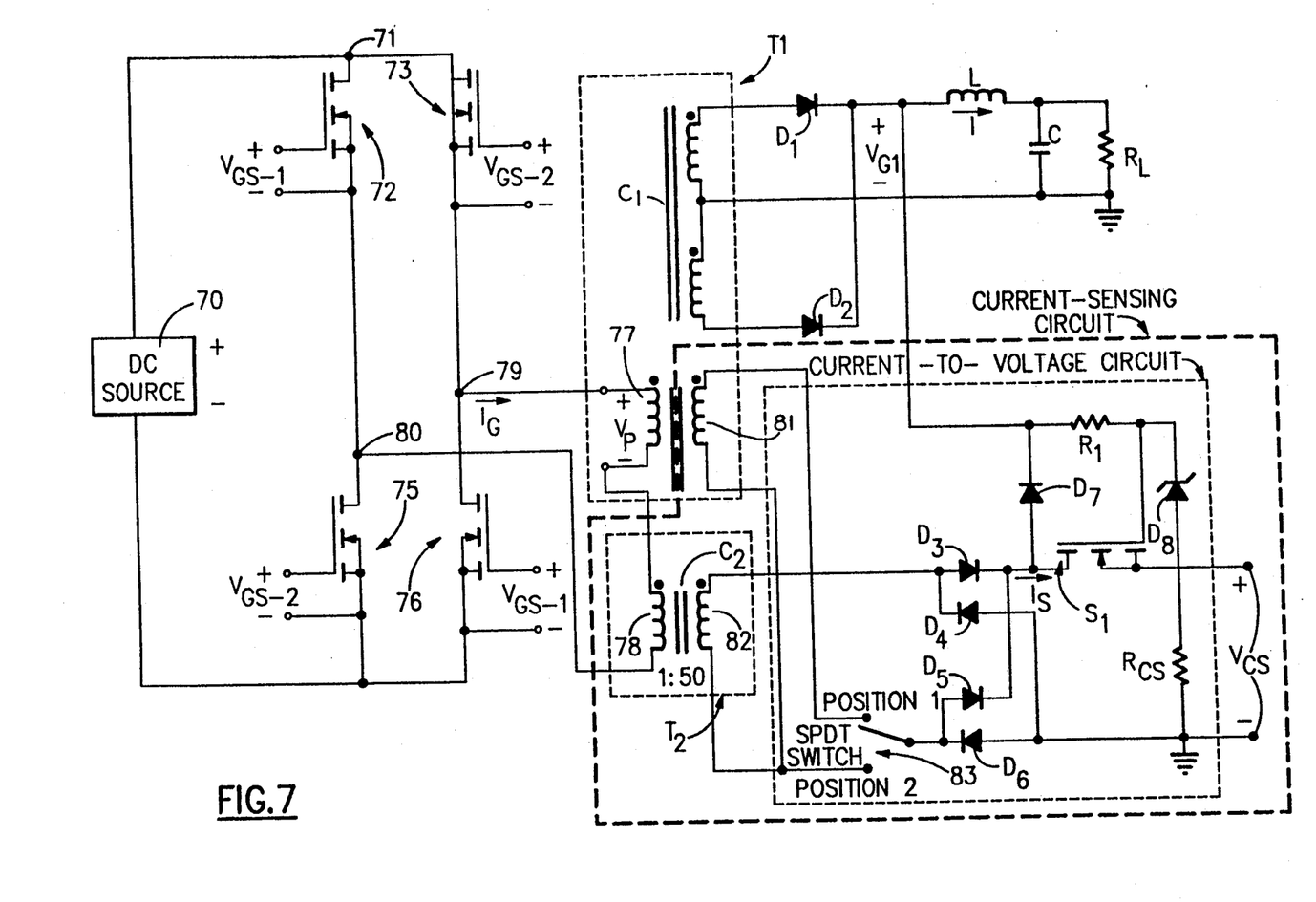
FIG. 7 is a detailed circuit to illustrate the effectiveness of the invention in a full-bridge converter arrangement as shown in FIG. 2, with a single pole double throw (SPDT) switch to connect a current-sensing transformer winding with the power transformer, in position 1, and to show the voltage, in position 2, with this winding not connected with the power transformer.

The circuit of FIG. 7 illustrates the improvement of the invention in a conventional full bridge DC-DC converter as will now be described. This circuit was assembled with component values for the particular purpose of demonstrating the effectiveness of the improvement provided by the invention.

A 28 volt direct current voltage source 70 is connected to a point 71 between two MOSFET switching transistors 72 and 73. The drain terminals of these two transistors 72 and 73 are connected to this point 71.

The other side of the source 70 is connected to a point 74 between two different switching MOSFET transistors 75 and 76. All four of the transistors 72, 73, 75 and 76 are of the 2N6764 type, as given in the chart hereinafter. As seen in this FIG. 7, a voltage $V_{GS1}$ is connected between the gate terminal and the source terminal of transistors 72 and 76, and a voltage $V_{GS2}$ is connected between the gate terminal and the source terminal of the transistors 73 and 75. The four voltage sources providing $V_{cs1}$ and $V_{cs2}$ are isolated galvanically from each other.

A primary winding 77 of a power transformer $T_1$ and a primary winding 78 of a current-sensing transformer $T_2$ are connected in series between the other two points 79 and 80 of this bridge circuit. In accordance with the invention, an additional winding 81 is located physically in a magnetic coupling relationship with the power transformer $T_1$ and is connected electrically in series with the current-sensing transformer $T_2$.

The additional winding 81 is connected electrically in series with the secondary winding 82 of the current-sensing transformer $T_2$, and a Single-Pole, Double-Throw (SPDT) switch, identified also by the numeral 83, is included in this circuit to demonstrate the effectiveness of the invention. It will be understood that the SPDT switch 83 is NOT normally included in a circuit that utilizes the invention and is included here only in order to demonstrate the effectiveness of an arrangement in accordance with the present invention.

In position 1, the additional winding 81 is operative, but in position 2, it is disconnected. As described hereinabove, in the practice of the invention, the SPDT switch 83 is NOT used, and the winding 81 is connected as if the switch 83 is in position 1, in which position the additional winding 81 is in series with the secondary winding 82 so that current leaving the positive end of winding 82 enters the positive end of winding 81 when primary winding 77 is energized by voltage $V_p$. Equivalently, the voltage on the additional winding 81 adds to the voltage $V_{cs}$ when the voltage $V_p$ is applied to the winding 77.

A small n-channel MOSFET $S_1$ is connected to function as a switch, with its gate terminal connected to the voltage $V_{G1}$. Therefore, the switch $S_1$ allows current from the secondary of the current transformer $T_2$ to be sensed only while the primary power transistors 71, 73, 75 and 76 are conducting (turned on).

The secondary current of the power transformer $T_1$, on the other hand, is rectified by two diodes $D_1$ and $D_2$ before it proceeds through an LC filter. The current in the secondary of the current transformer $T_2$ is rectified by diodes $D_3$, $D_4$, $D_5$ and $D_6$ producing current $I_s$.

The diode $D_7$ clamps the secondary of the transformer $T_2$ to ground while the transistors 72, 73, 75 and 76 are off. The diode $D_8$ protects $S_1$ from excessive gate-to-source voltage. $R_1$ precludes the high frequency self-oscillation of the switch $S_1$.

The transformers $T_1$ and $T_2$ are the same as used in FIG. 5, except the secondary of $T_1$ has 2 turns on each side of the center tap. A chart of the values for the elements used in FIG. 7 are as follows:

| CIRCUIT ELEMENT | VALUE |
| --- | --- |
| 70 | 28 volts dc |
| 72, 73, 75, 76 | 2N6764 |
| $S_1$ | 2N6762 |
| $D_1$, $D_2$ | 1N6391 |
| $D_3$, $D_4$, $D_5$, $D_6$, $D_7$ | 1N4148 |
| $D_8$ | 1N4471 |
| $R_1$ | 10 Ohms |
| $R_{cs}$ | 5.1 Ohms |
| L | 7.5 micro Henrys |
| C | 125 micro Farads |

Figure 8:
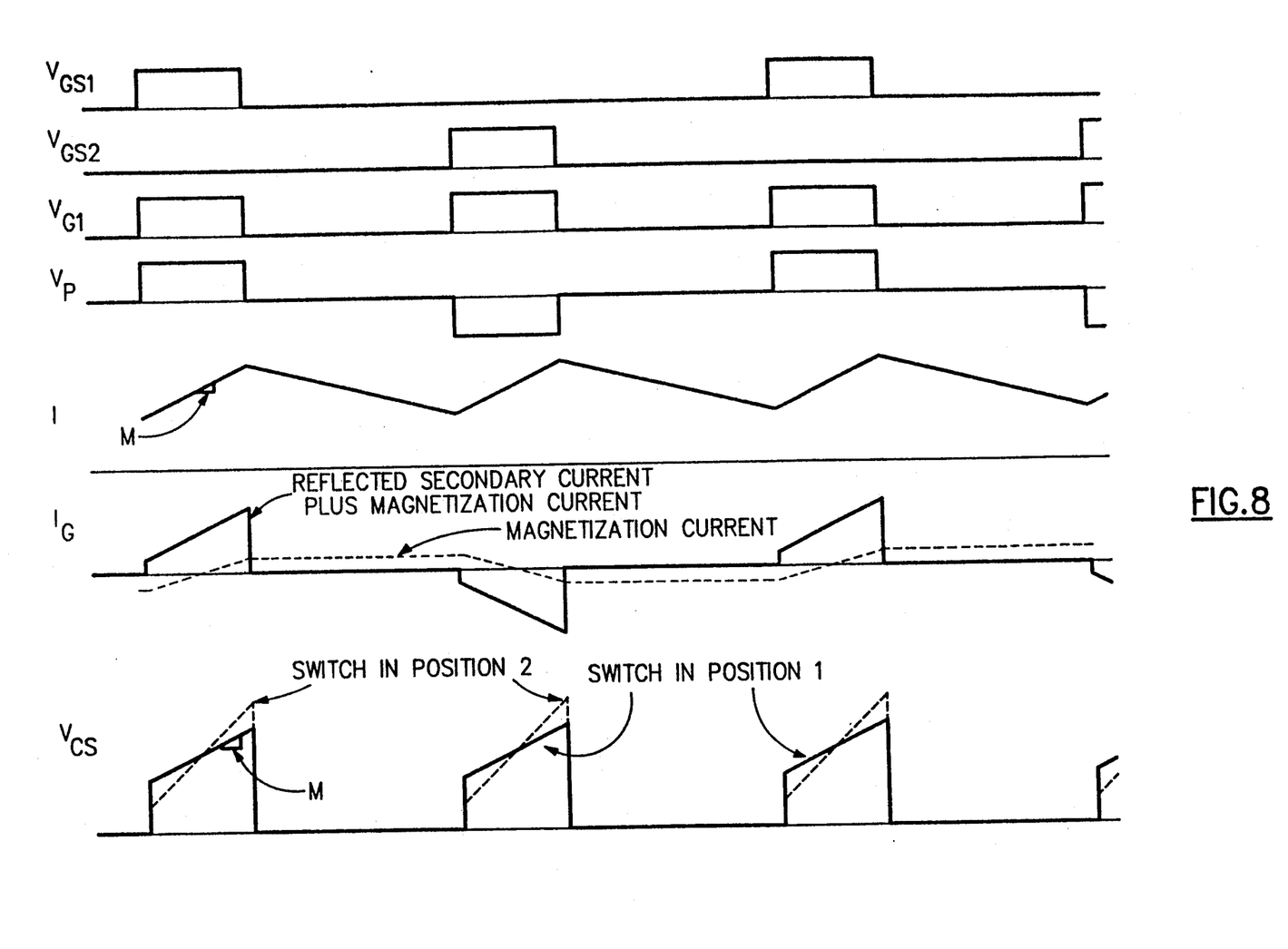
FIG. 8 is a timing chart illustrating the relative interrelationship of respective voltage and current signals that are indicated in FIG. 7.

FIG. 8 shows voltage and current curves illustrating this operation graphically. The lowermost curve, the voltage $V_{cs}$, shows this voltage without the arrangement of the invention (switch in position 2, FIG. 7) and the slope of this voltage with the arrangement of the invention in place (switch in position 1, FIG. 7). Clearly, with the invention in place in the circuit, the slope M of $V_{cs}$ matches more nearly that of the current I.

While the invention has been shown and described particularly with reference to a preferred embodiment thereof, it will be understood by those skilled in the art that various changes in form and detail may be made without departing from the spirit and scope of the invention, as defined by the following claims.

What is claimed is:

1. A switched-mode DC-DC power converter having:
   input means, output means and power transformer means with a primary winding and a secondary winding connected for the separation of said input means and said output means; and
   current-sensing transformer means with a primary winding and a secondary winding, and
   said power converter being characterized by:
   an additional winding coupled magnetically with said power transformer means for sensing a load current in said secondary winding of said power transformer, said additional winding being connected electrically with said current-sensing transformer means; and
   current-sensing circuit means connected to limit the effect of the magnetization current of both said power transformer means and said current-sensing transformer means;
   whereby said magnetization current is prevented from degrading said sensed load current.

2. A switched-mode DC-DC power converter as defined by claim 1 wherein said additional winding is connected electrically with said secondary winding of said current-sensing transformer means.

3. A switched-mode DC-DC power converter as defined by claim 1 wherein said additional winding is connected electrically in series with said secondary winding of said current-sensing transformer means.

4. A switched-mode DC-DC power converter as defined by claim 1 wherein said additional winding has predetermined turns to affect a predetermined limit for said magnetization current.

5. A switched-mode DC-DC power converter as defined by claim 1 wherein said additional winding has predetermined turns arranged in a predetermined relationship with said secondary winding of said current-sensing transformer means.

6. A switched-mode DC-DC power converter as defined by claim 1 wherein said input means includes bridge connected means.

7. A switched-mode DC-DC power converter as defined by claim 1 wherein said input means includes a bridge connected combination of components the output of which is connected to said power transformer means and to said current-sensing transformer means.

8. A switched-mode DC-DC power converter as defined by claim 1 wherein said input means includes a plurality of MOSFETs connected in a predetermined arrangement.

9. A switched-mode DC-DC power converter as defined by claim 1 wherein said input means includes a bridge circuit with a plurality of switching transistor means in a predetermined relationship.

10. A switched-mode DC-DC power converter as defined by claim 1 wherein said current-sensing circuit includes at least said current-sensing transformer means, and said additional winding.

11. A switched-mode DC-DC power converter as defined by claim 1 wherein both said power transformer means and said current-sensing transformer means have cores formed of the same material.

12. A switched-mode DC-DC power converter as defined by claim 1 wherein both said power transformer means and said current-sensing transformer means are formed of cores of the same material.

13. A switched-mode DC-DC power converter as defined by claim 1 wherein said additional winding has a number of turns defined by the relationship:

$$\frac{L_c}{L_p} = \frac{n_B}{n_p \times n_c}$$

where:
- $L_c$ = inductance on primary side of the current-sensing transformer;
- $L_p$ = inductance on primary side of the power transformer;
- $n_B$ = turns ratio of additional winding to power transformer secondary;
- $n_p$ = turns ratio of power transformer primary to secondary;
- $n_c$ = turns ratio of current-sensing transformer secondary to primary.

14. A switched-mode DC-DC power converter as defined by claim 1 wherein a voltage on the secondary winding of said current-sensing transformer is related to a voltage on the primary of said power transformer in accordance with the relationship:

$$\frac{V_s}{V_p} = \frac{n_c \times L_c}{L_p}$$

where:
- $V_s$ = voltage on secondary of the current-sensing transformer;
- $V_p$ = voltage on primary of the power transformer;
- $n_c$ = turns ratio of current-sensing transformer, secondary to primary;
- $L_c$ = inductance on primary side of the current-sensing transformer;
- $L_p$ = inductance on primary side of the power transformer.

15. A switched-mode DC-DC power converter as defined by claim 1 wherein the turns ratio to accomplish said limit on said magnetization current is in accordance with the relationship:

$$\frac{L_c}{L_p} = \frac{n_B}{n_p \times n_c} \; ; \text{ and}$$

a voltage on the secondary winding of said current-sensing transformer is related to a voltage on the primary winding of said power transformer in accordance with the relationship:

$$\frac{V_s}{V_p} = \frac{n_c \times L_c}{L_p} \; ;$$

where:
- $L_c$ = inductance on primary side of the current-sensing transformer;
- $L_p$ = inductance on primary side of the power transformer;
- $n_B$ = turns ratio of additional winding to power transformer secondary;
- $n_p$ = turns ratio of primary winding to power transformer secondary;
- $n_c$ = turns ratio of current-sensing transformer, secondary to primary;
- $V_s$ = voltage on secondary of the current-sensing transformer;
- $V_p$ = voltage on primary of the power transformer.

* * * * *